(12) United States Patent
Murakami

(10) Patent No.: US 6,909,124 B2
(45) Date of Patent: Jun. 21, 2005

(54) LIGHT EMITTING DEVICE AND METHOD OF MANUFACTURING THE SAME

(75) Inventor: Satoshi Murakami, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/606,071

(22) Filed: Jun. 25, 2003

(65) Prior Publication Data

US 2004/0000673 A1 Jan. 1, 2004

(30) Foreign Application Priority Data

Jun. 28, 2002 (JP) ........................................ 2002-189422

(51) Int. Cl.⁷ .......................................... H01L 31/3052
(52) U.S. Cl. ............................. 257/98; 257/59; 257/84
(58) Field of Search .............................. 257/59, 84, 98

(56) References Cited

U.S. PATENT DOCUMENTS

| | | | | |
|---|---|---|---|---|
| 6,043,857 A | * | 3/2000 | Kurauchi et al. | ........... 349/106 |
| 6,091,195 A | | 7/2000 | Forrest et al. | .............. 313/504 |
| 6,124,604 A | * | 9/2000 | Koyama et al. | .............. 257/72 |
| 6,150,692 A | * | 11/2000 | Iwanaga et al. | ............. 257/315 |
| 6,252,297 B1 | * | 6/2001 | Kemmochi et al. | ......... 257/640 |
| 6,346,718 B1 | * | 2/2002 | Yamanaka et al. | ............. 257/79 |
| 6,475,836 B1 | | 11/2002 | Suzawa et al. | |
| 6,686,228 B2 | | 2/2004 | Suzawa et al. | |
| 2001/0030322 A1 | | 10/2001 | Yamazaki et al. | ............ 257/59 |
| 2002/0063515 A1 | | 5/2002 | Goto | .......................... 313/500 |

FOREIGN PATENT DOCUMENTS

| | | |
|---|---|---|
| JP | 2001-313397 A | 11/2001 |
| JP | 2002-208491 A | 7/2002 |
| JP | 2003-017273 A | 1/2003 |

* cited by examiner

Primary Examiner—Allan R. Wilson
(74) Attorney, Agent, or Firm—Cook, Alex, McFarron, Manzo, Cummings & Mehler, Ltd.

(57) ABSTRACT

To provide a light emitting device capable of promoting an efficiency of taking out light to outside and achieving highly reliable bright image display by lower power consumption, in a light emitting device including a plurality of pixels and including a transistor and a pixel electrode electrically connected to the transistor at each of the plurality of pixels, an insulating film provided below the pixel electrode includes an opening portion an side surface of which is a curved face at a light emitting region. Light emitted from a light emitting element is focused by the curved face provided at the insulating film to reduce propagation thereof in a lateral direction, the efficiency of taking out the light is promoted and therefore, bright image display can be achieved without particularly increasing a current amount to be injected.

28 Claims, 12 Drawing Sheets

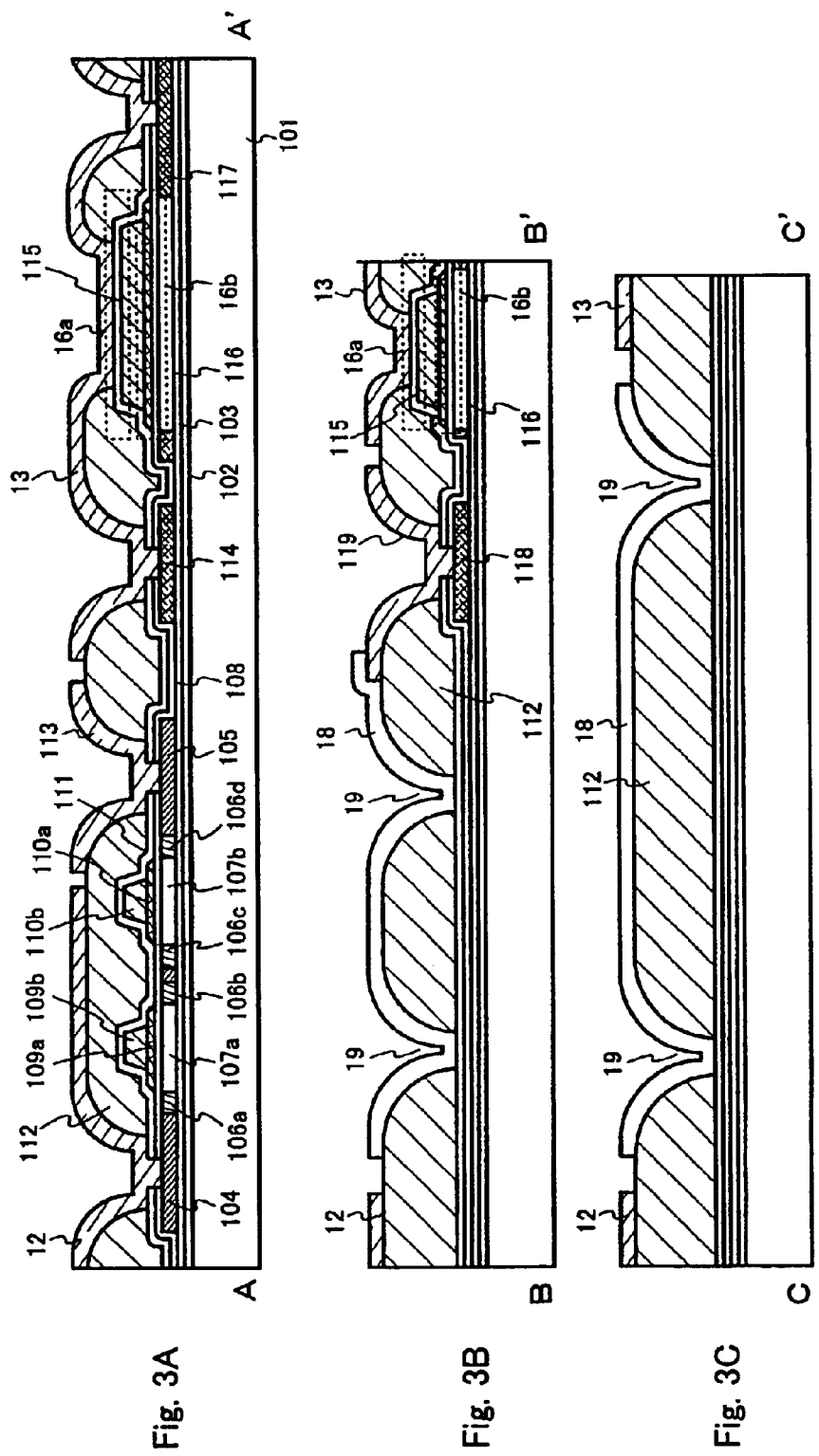

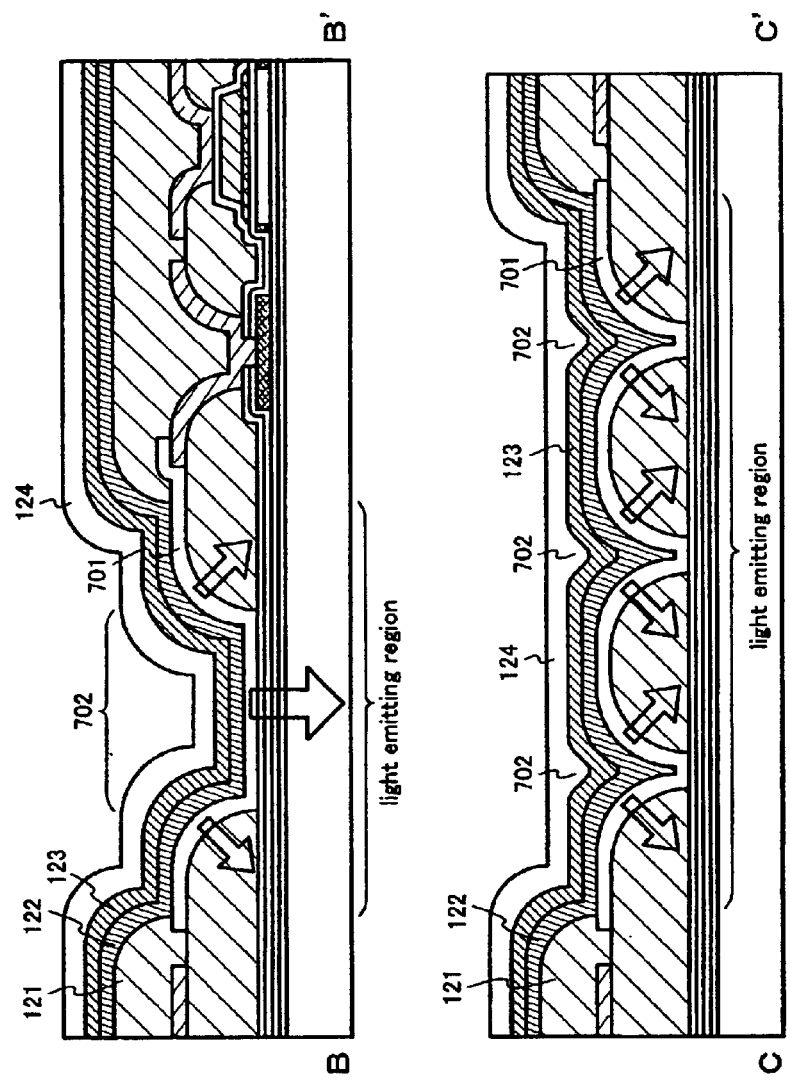

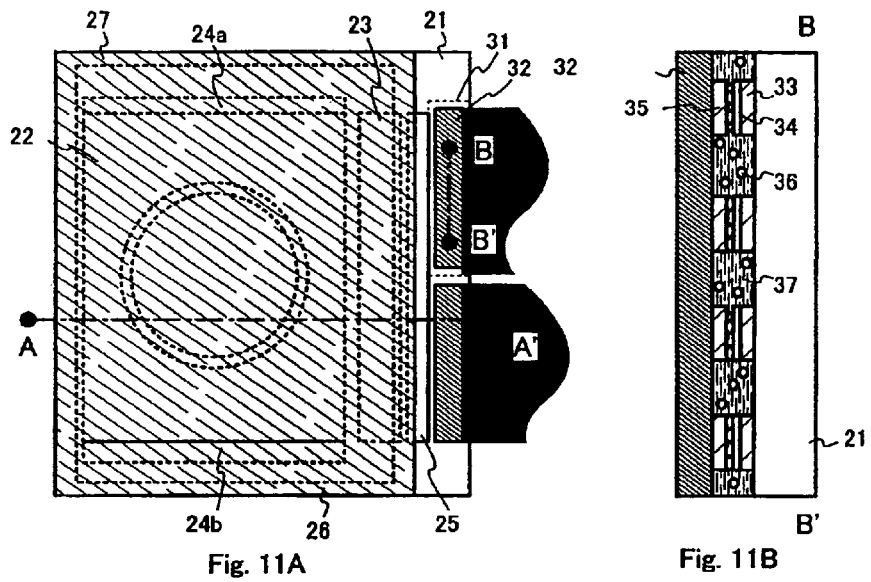
Fig. 11A
Fig. 11B
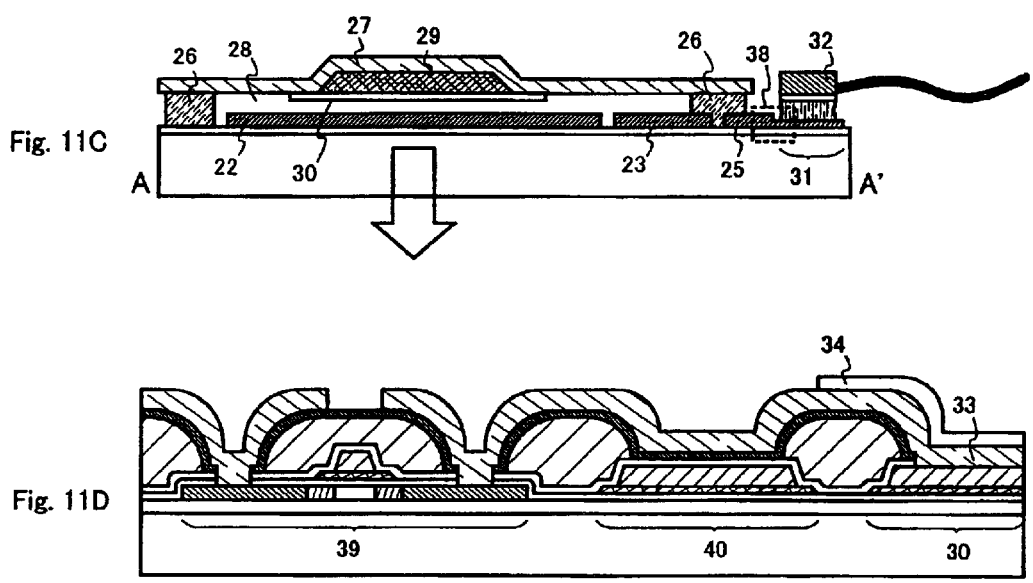
Fig. 11C
Fig. 11D

LIGHT EMITTING DEVICE AND METHOD OF MANUFACTURING THE SAME

FIELD OF THE INVENTION

The present invention relates to a technical field of an active matrix type light-emitting device using electric field-effect type transistors. This invention especially relates to a technical field with respect to a light emitting display device in which thin film transistors are provided in a plurality of pixels respectively.

DESCRIPTION OF THE RELATED ART

In recent years, the development of a light emitting display device in which thin film transistors (TFTs) are integrated over a glass substrate has been progressed. Especially, an active matrix type light emitting display device in which transistors are provided in respective pixels is suitable for reproduction of moving pictures because of its high response speed. Therefore, the product development of the active matrix type light emitting display device has been hurried for future diffusion of digital contents. However, low reliability is cited as the biggest problem in productization of the light emitting display device.

A light emitting material (mainly, an organic compound) that is used to the light emitting display device emits light by flowing a trace amount of electric current. However, the light emitting material has defects of serious deterioration and shorter lifetime. The probability of deterioration of the light emitting material is increased when the amount of flowing electric current is increased. On the other hand, luminance of the light emitting material is decreased when the amount of flowing electric current is reduced. That is, the light emitting display device has a relationship of trade-off between bright image display and high reliability.

Ultimately, the bright image display with few amount of electric current depends on how the generated light can be taken out outside to effectively. Conventionally, a low inner quantum efficiency and the like caused by characteristics of the light emitting material itself has been a problem. However, improvement in this field has been advanced by the development of phosphorescent light emitting materials and the like of a triplet exciton. As result, the most desired improvement at present is a low efficiency of taking out the generated light to outside of 20%, therefore light loss due to the inner reflection in a multi-layered film and a substrate surface has been a problem.

SUMMARY OF THE INVENTION

In view of the aforementioned problems, an object of the present invention is to provide a technique to improve the efficiency of taking out the generated light without increasing the number of process. Furthermore, another object of the present invention is to achieve bright image display with low power consumption by promoting the efficiency of light and provide a light emitting device capable of displaying bright image without deteriorating reliability.

The invention is a light emitting device including a plurality of pixels and including a transistor and a pixel electrode electrically connected to the transistor at each of the plurality of pixels, wherein an insulating film provided below the pixel electrode includes an opening portion a side surface of which is a curved face in a light emitting region. The opening portion indicates an opening portion formed at the insulating film provided below the pixel electrode formed by means of etching or the like. That is, the invention is characterized in that in the light emitting region (refers to a region capable of optically recognizing light in a pixel), by providing the opening portion the side surface of which is the curved face at the insulating film below the pixel electrode and forming the pixel electrode to cover the opening portion, undulations (recesses and projections) along the shape of the opening portion are provided to the pixel electrode. Therefore, a surface of the pixel electrode is provided with the curved face along the shape of the opening portion.

The gist and the effect of the invention will be explained in reference to FIG. 1. In FIG. 1, numeral 101 designates an insulating film, numeral 102 designates an opening portion provided at the insulating film 101, numeral 103 designates a pixel electrode, numeral 104 designates a light emitting layer and numeral 105 designates an opposed electrode. Although as the insulating film 101, it is preferable to use a photosensitive resin film of a photosensitive acrylic resin film, a photosensitive polyimide film or the like such that the side surface of the opening portion 102 can be constituted by the curved face, a material other than the photosensitive resin film may be used so far as the side surface of the opening portion 102 can be constituted by the curved face by adjusting etching conditions. Further, the photosensitive resin film is ordinarily colored in light brown color and therefore, it is necessary to make the photosensitive resin film transparent to visible light by subjecting the photosensitive resin film to decoloring treatment (bleaching treatment). In the decoloring treatment, light (typically ultraviolet ray) used in exposure may be irradiated to a total of a pattern after development.

Further, the opening portion 102 indicates a portion of the insulating film 101 at which a thickness of the insulating film 101 is increasing centering on a portion thereof constituting a recess shape by removing the insulating film 101 with a radius of curvature. The radius of curvature needs not to be always constant but may be changed continuously or in steps. For example, in the case of the photosensitive resin film, the side surface of the opening portion becomes the curved face necessarily by exposure and development and the opening portion which constitutes the invention naturally includes also the opening portion formed in this way. Further, the shape of the opening portion is not particularly limited but may be constituted by a groove shape, a circular shape, a lattice shape or other geometrical shape and a position for forming the opening portion may be regular or may be irregular.

The pixel electrode 103 is an electrode comprising a conductive film for transmitting visible light and typically, an oxide conductive film of indium oxide, tin oxide, a compound of tin oxide and zinc oxide, a compound of indium oxide and zinc oxide or the like can be used therefor. Or, the pixel electrode 103 may be constituted by a laminated body of a metal film having a thickness capable of transmitting visible light (typically, a thickness equal to or smaller than 100 nm) and an oxide conductive film. Since the pixel electrode 103 is provided over the insulating film 101 provided with the opening portion 102, the pixel electrode 103 covers the opening portion 102 as shown by FIG. 1, as a result, the surface of the pixel electrode 103 is provided with a curved face along the shape of the opening portion.

Further, the light emitting layer 104 is a laminated body constituted by laminating a light emitting layer, a carrier injecting layer, a carrier transporting layer, a carrier hampering layer and other organic compound or inorganic compound necessary for luminescence. Any publicly-known constitution may be used for a constitution of the light emitting layer 104. Further, an element provided with a light emitting layer between a pair of electrodes (in this case, the pixel electrode 103 and the opposed electrode 105) is referred to as a light emitting element. One of the pair of electrodes is referred to as anode and other thereof is referred to as cathode. The anode is an electrode on a side of injecting a hole and therefore, a material having a comparatively high work function is used and the cathode is a electrode on a side of injecting an electron and therefore, a material having a comparatively low work function is used. In the case of FIG. 1, when an oxide conductive film is used for the pixel electrode 103, the pixel electrode 103 becomes the anode and when a metal film including an element belonging to group 1 or group 2 of the periodic table is used for the opposed electrode 105, the opposed electrode 105 becomes the cathode.

The technical thought of the invention will be explained here. When voltage is applied between the pixel electrode 103 and the opposed electrode 105, holes and electrons are injected to the light emitting layer 104 and recombined at inside of the light emitting layer 104 and light is emitted. Although generated light advances radially, the most portion thereof transmits through the pixel electrode 103 for transmitting visible light and is optically recognized. In FIG. 1, both of light directly transmitting therethrough and light reflected by the opposed electrode 105 are described as normal light. Further, there is present light propagating at inside of the light emitting layer 104 by being randomly reflected in a film face direction in the generated light and in the related art, the propagated light is propagated to an end of a substrate and is light which cannot be taken out. However, by embodying the invention, all of the pixel electrode 103, the light emitting layer 104 and the opposed electrode 105 are provided with the curved faces and therefore, the propagated light in the film face direction can be directed to a lower side to take out, as a result, an amount of light which can be optically recognized is increased more than that in the structure of the prior art. That is, brightness of display can be increased.

As described above, the invention is characterized in constructing a constitution in which the structure per se of the light emitting element is provided with a radius of curvature by providing the opening portion the side surface of which is the curved face at the insulating film and the propagated light which is propagated over a plurality of pixels in the related art can be made to stay at individual pixels to take out and as an effect thereof, by efficiently taking out the propagated light propagated in the film face direction of the light emitting layer, the brightness in the light emitting region can be increased without increasing power consumption (that is, without deteriorating reliability). Further, the opening portion may be formed when a contact hole is formed at the insulating film and therefore, it is not particularly necessary to increase the number of steps in forming the opening portion.

BRIEF DESCRIPTION OF THE DRAWINGS

FIGS. 3A to 3C are sectional views of the pixel of the light emitting device;

FIGS. 8A and 8B are sectional views of the pixel of the light emitting device;

FIGS. 11A to 11D are views constituting an outlook of a light emitting device.

DETAILED DESCRIPTION OF THE PREFERRED EMBODIMENTS

[Embodiment 1]

Figure 2B:
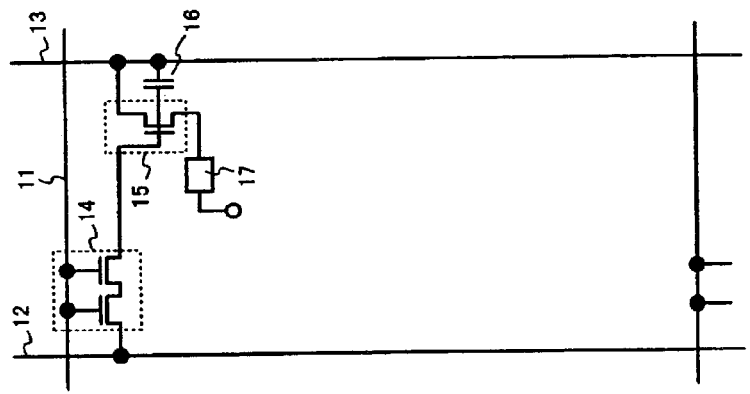
FIGS. 2A and 2B are a top view of a pixel and a circuit diagram of a light emitting device.
Figure 2A:
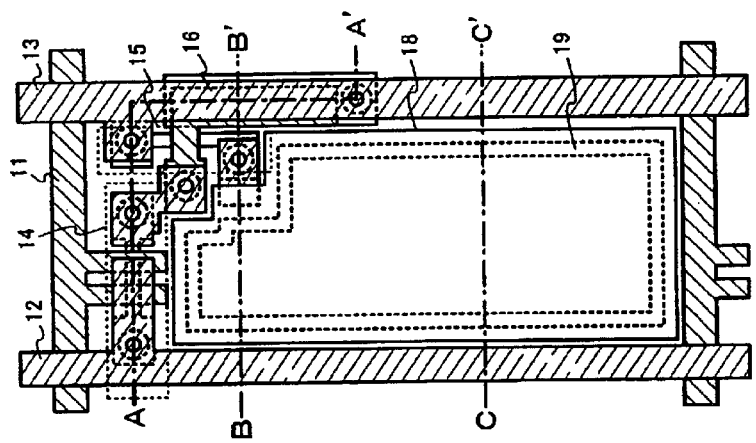

The embodiment is an example of a light emitting display device of the invention. In FIGS. 2A and 2B, FIG. 2A is a top view of a pixel of the light emitting display device (however, up to forming a pixel electrode) and FIG. 2B is a circuit diagram thereof. Further, drawings in correspondence with sectional views provided by cutting FIG. 2A along lines A–A', B–B' and C–C' are respectively FIGS. 3A through 3C.

As shown by FIGS. 2A and 2B, a pixel portion of the light emitting display device is provided with a plurality of pixels surrounded by a gate wiring 11, a data wiring 12 and a power source wiring (wiring for supplying constant voltage or constant current)13 in a matrix arrangement and each pixel is provided with a thin film transistor (hereinafter, referred to as switching TFT) 14 functioning as a switching element, TFT (hereinafter, referred to as driving TFT) 15 functioning as means for supplying current or voltage for making a light emitting element emit light, a capacitor portion 16 and a light emitting element 17. The light emitting element 17 can be formed by providing a light emitting layer over a pixel electrode 18, although not illustrated here. Further, an opening portion 19 which is a characteristic of the invention is indicated by a dotted line since the opening portion 19 is provided below the pixel electrode 18.

Further, although according to the embodiment, an n-channel type TFT having a multigate structure is used as the switching TFT 14 and a P-channel type TFT is used as the driving TFT 15, a pixel constitution of a light emitting device needs not to limit thereto and the invention is applical to any publicly-known constitution.

The n-channel type TFT 14 and the capacitor portion 16 appear in the sectional view of FIG. 3A. Numeral 101 designates a substrate and a glass substrate, a ceramic substrate, a quarts substrate, a silicon substrate or a plastic substrate (including a plastic film) can be used therefor. Further, numeral 102 designates a silicon nitroxide film, numeral 103 designates a silicon oxynitride film and the films are laminated to function as a matrix film. Naturally, it is not necessary to limit to these materials. Further, an activation layer of the n-channel type TFT 14 is provided over the silicon oxynitride film 103 and the activation layer includes a source region 104, a drain region 105, LDD regions 106a through 106d, and channel forming regions 107a, 107b and the two channel forming regions and four LDD regions are provided between the source region 104 and the drain region 105.

Further, the activation layer of the n-channel type TFT 14 is covered by a gate insulating film 108 over which gate electrodes 109a and 109b and gate electrodes 110a and 110b are provided. Although a silicon oxynitride film is used according to the embodiment as the gate insulating film 108, when a nitride insulating film, mentioned above, of an aluminum nitride film or the like having a high specific inductive capacity is used, an occupied area of the element can be reduced and therefore, the film is effective in promoting an integration degree.

Further, as the gate electrodes 109a and 110a, tantalum nitride films are used and as the gate electrodes 109b and 110b, tungsten films are used. Such a structure can be constituted by selecting an etching condition since these metal films are provided with high selection ratios to each other. With regards to the etching condition, JP-A-2001-313397 by the applicant may be referred to.

Further, a silicon nitride film or a silicon nitroxide film is provided as an insulating film 111 for covering the gate electrodes and a photosensitive resin film is provided thereover as a flattening film 112. Although according to the embodiment, a positive type photosensitive acrylic resin film is used as the flattening film, a negative type photosensitive acrylic resin film or a positive type photosensitive polyimide film may be used therefor.

In this case, first contact portions are provided at a laminated body comprising the gate insulating film 108 and the insulating layer 111 over the source region 104 and over the drain region 105 and the flattening film 112 is provided with second contact portions to contain the first contact portions at inside thereof. For such structure, there may be selected either method of (1) a method of previously forming the first contact portion and thereafter, embedding the first contact portion temporally by the flattening layer and further forming the second contact portion and (2) a method of providing the flattening layer and thereafter forming the second contact portion and thereafter, forming the first contact portion at inside of the second contact portion by using a new mask. However, although it is preferable to use a dry etching method for forming the first contact portion, it is preferable to avoid the flattening film 112 from being exposed to plasma and the method of (1) may be regarded as preferable in that meaning.

Further, at this occasion, simultaneous with forming the second contact portion provided at the flattening film 112, the opening portion which is the characteristic of the invention is formed at the light emitting region. That is, it is not necessary to particularly increase a process in forming the opening portion for providing a curved face at the pixel electrode. Naturally, in forming the first contact portion, the light emitting region may be covered by a resist mask or the like. It is an object of forming the opening portion to provide the curved face on the surface of the pixel electrode and therefore, when the opening portion is formed only at the flattening film 112, it is sufficient for the object.

Further, the data wiring 12 and a connection wiring (corresponding to a drain electrode) 113 are connected to the source region 104 or the drain region 105 via the first opening portion and the second opening portion. The connection wiring 113 is a wiring connected to the gate of the driving TFT 15. A structure of interposing a wiring whose major component is a metal having low resistance such as aluminum or copper by other metal films or a film of an alloy of these metals may be used for the data wiring 12 and the connection wiring 113.

Further, numeral 114 designates a source region of the driving TFT 15 which is connected with the power source wiring 13. Further, the power source wiring 13 is opposed to a gate wiring 115 of the driving TFT 15 via the insulating layer 111 and forms a storage capacitor 16a. Further, the gate wiring 115 is opposed to a semiconductor film 116 via the gate insulating film 108 and forms a storage capacitor 16b. Since the power source wiring 13 is connected to a semiconductor film 117, the semiconductor film 116 functions as an electrode by being supplied with electric charge therefrom. Since the capacitor portion 16 is constructed by a constitution of connecting the storage capacitors 16a and 16b in parallel in this way, large capacitance is provided by a very small area. Further, a silicon nitride film having a high specific inductive capacity is used particularly for the storage capacitor 16a as a dielectric body and therefore, large capacitance can be ensured.

When the first opening portion and the second opening portion, mentioned above, are formed, although the number of masks used in photolithography steps is increased compared with that of the related art, by conversely utilizing the increase in the number of masks, as shown by the embodiment, the storage capacitor is newly formed. The point is also one of characteristics of the invention. The characteristic sufficiently compensates for the disadvantage of the increase in the masks, as a result, significantly contributes to development of industry. For example, in order to achieve highly fine image display, it is necessary to promote an aperture rate by reducing an occupied area of the storage capacitor relative to an area of each element in a display portion and for that purpose, an increase in the storage capacitor is extremely useful.

Further, in FIG. 3B, numeral 118 designates a drain region of the driving TFT 15 which is connected to a drain electrode 119. Further, the drain electrode 119 is connected to the pixel electrode 18 to constitute the pixel. Although according to the embodiment, an oxide conductive film (representatively, ITO film) which is transparent to visible light is used as the pixel electrode 18, the film is not limited thereto. Further, by forming the pixel electrode 18 after forming the drain electrode 119, there is constructed a constitution in which the pixel electrode 18 is connected to be brought into contact with an upper face of the drain electrode 119. At this occasion, as shown by FIG. 3B, the opening portion 19 is recognized at the flattening film 112. A side surface of the opening portion 19 is constituted by a curved face and also a surface of the pixel electrode 18 is constituted by a curved face therealong.

Figures 4A, 4B:
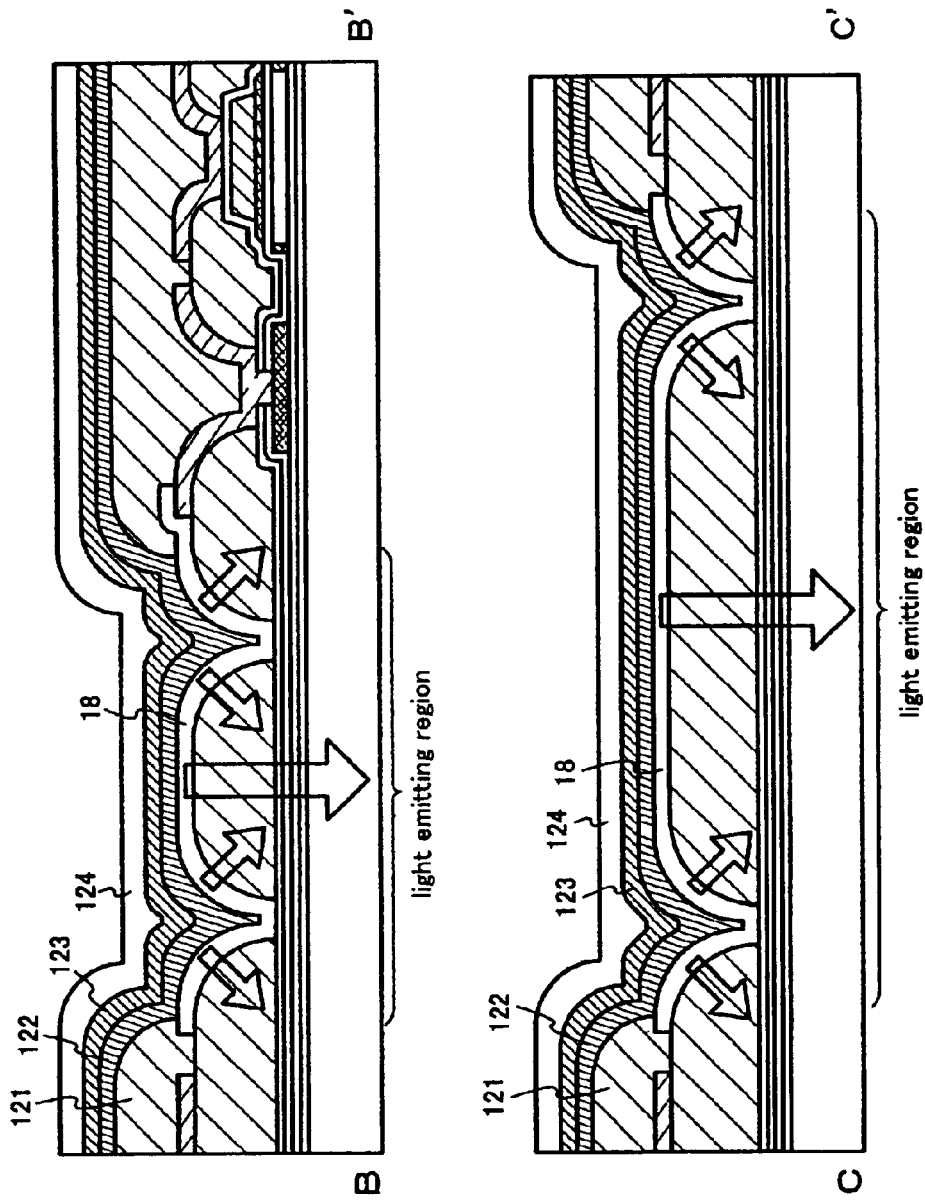
FIGS. 4A and 4B are sectional views of the pixel of the light emitting device.

Next, FIGS. 4A and 14B are drawings respectively in correspondence with FIGS. 3B and 3C, showing a state of finishing the light emitting display device. After providing the pixel electrode 18, an insulating film 121 for partitioning the light emitting region is provided. Although the insulating film 121 may be an inorganic insulating film or a resin film, it is regarded to be preferable to form the insulating film 121 by a material the same as that of the flattening film 112 in view of reducing fabrication cost. According to the embodiment, a positive type photosensitive acrylic resin film is used therefor similar to the flattening film 112.

When the insulating film 121 is provided, a light emitting layer 122, an opposed electrode 123 and a protective film 124 are successively formed thereover. It is preferable to continuously form these films without exposing to the atmosphere since adsorption of oxygen or moisture causing a deterioration can be prevented. Although as the light emitting layer 122, any publicly-known material and structure may be used, according to the embodiment, as the pixel electrode, an oxide conductive film functioning as anode is used and therefore, it is preferable to provide a hole injecting layer or a hole transporting layer at a lowermost layer (layer in contact with the pixel electrode) thereof. Further, conversely, as the opposed electrode 123, a metal film including an element belonging to group 1 or group 2 of the periodic table may be provided to function as a cathode. According to the embodiment, a film of an alloy of aluminum and lithium is used.

The protective film 124 is preferably provided with barrier performance sufficient for preventing invasion of oxygen and moisture from outside and an insulating film as dense as possible may be used therefor. Further, since the protective film 124 is provided after providing the light emitting layer 122, it is necessary to adopt a film forming method capable for forming a film at room temperature such as a sputtering method in consideration of heat resistance of the light emitting layer 122. Although according to the embodiment, a silicon nitride film is provided by a sputtering method, it is not necessary to limit thereto. Further, it is not necessary to constitute the protective film 124 by a single layer but may be constituted by a laminated layer.

Figure 1:
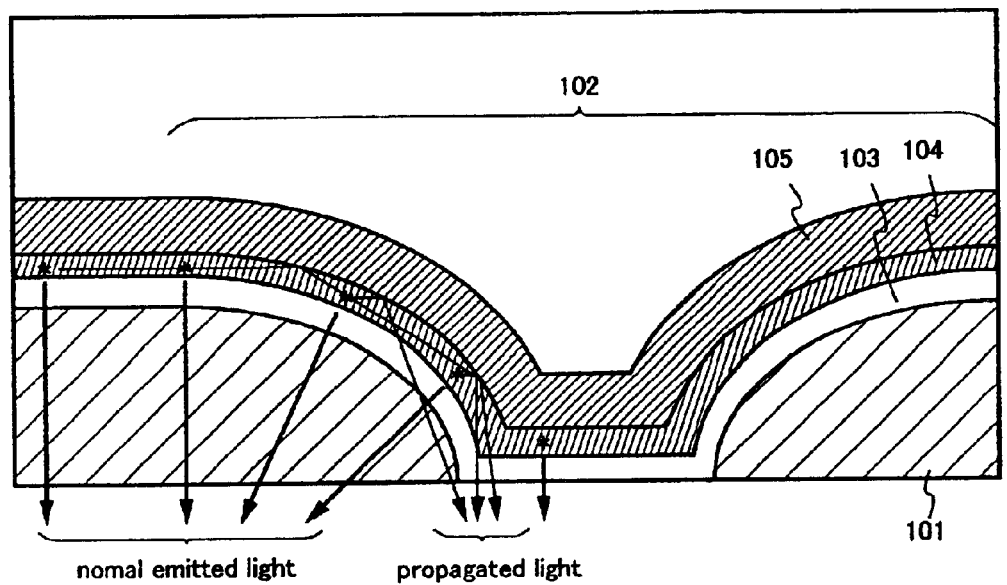
FIG. 1 is an explanatory view of the basic principle of the invention.

According to the light emitting display device having the above-described constitution, as shown by FIGS. 4A and 4B, light is irradiated to a side of the substrate 101 and as explained in reference to FIG. 1, the curved face derived from the opening portion provided at the flattening film 112 serves as a focusing lens, an efficiency of collecting light to a side of the light emitting region is promoted and brightness is increased. A direction of light is as shown by an arrow mark and in addition to light capable of being directly recognized optically as in the related art, light emitted from a portion of the pixel electrode 18 having the curved face (including propagated light) is present.

As described above, by embodying the invention by the constitution shown in the embodiment, the surface of the pixel electrode 18 can be constituted by the curved face at the light emitting region in the pixel (which may be referred to as a region partitioned by the insulating film 121 or a region at which the pixel electrode 18 and the light emitting layer 122 are brought into contact with each other) and an effect of collecting the propagated light can be provided. In this way, there can be provided the light emitting display device increasing the efficiency of taking out the generated light to outside without particularly increasing the number of process, achieving bright image display by low power consumption and achieving bright image display without deteriorating reliability.

[Embodiment 2]

According to the embodiment, an explanation will be given of an example in which a shape of an opening portion provided at the light emitting region is different from that of Embodiment 1. An explanation will be given in reference to FIGS. 5A and 5B and FIGS. 6A and 6B, notations are provided only for constitutions different from those of Embodiment 1 and notations the same as those of Embodiment 1 are used for other portions.

Figure 5B:
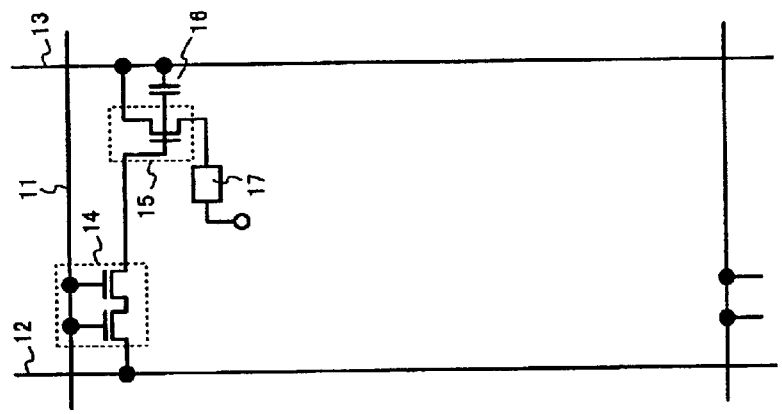
FIGS. 5A and 5B are a top view of a pixel and a circuit diagram of a light emitting device.
Figure 5A:
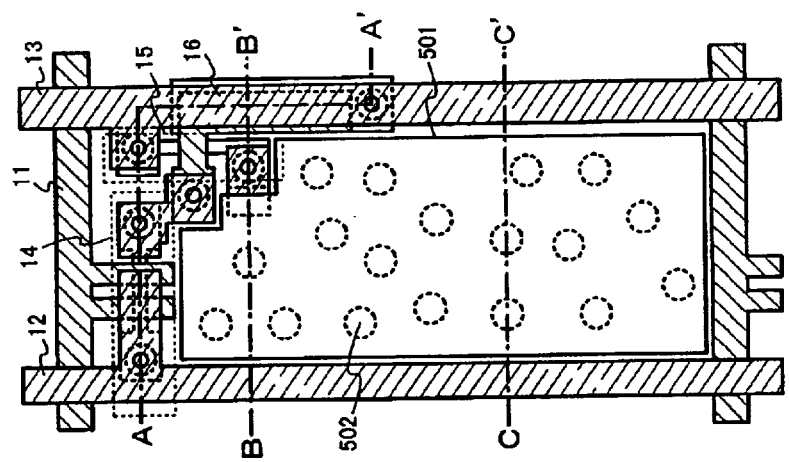

In FIG. 5A, constitutions different from those of Embodiment 1 are a pixel electrode 501 and an opening portion 502. The opening portion 502 is an example of constituting a shape of the opening portion by a circular shape and providing the opening portion irregularly at inside of the light emitting region. Further, it is not necessarily needed to provide the opening portions 502 irregularly but the opening portions 502 can also be aligned regularly.

Figure 6A:
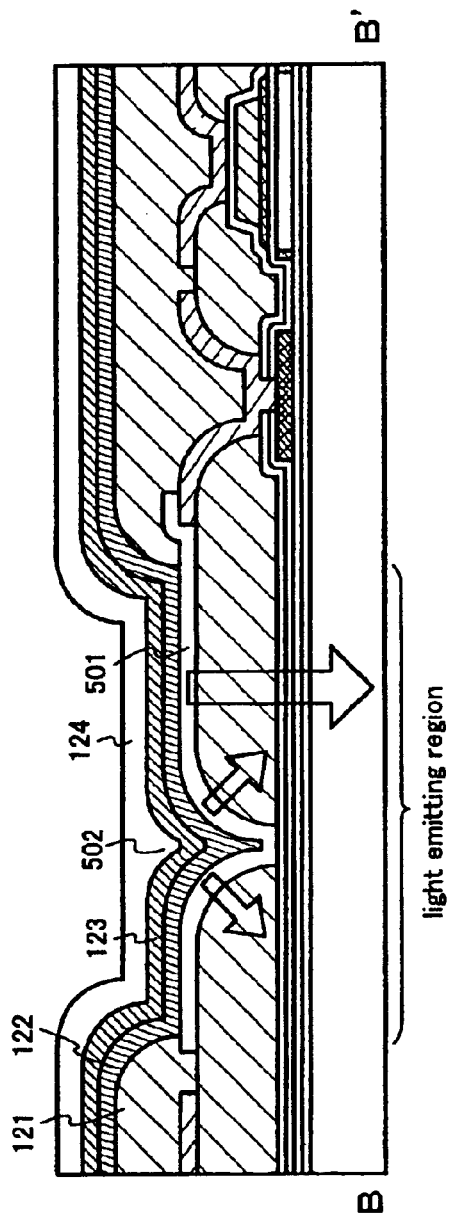
FIGS. 6A and 6B are sectional views of the pixel of the light emitting device.
Figure 6B:
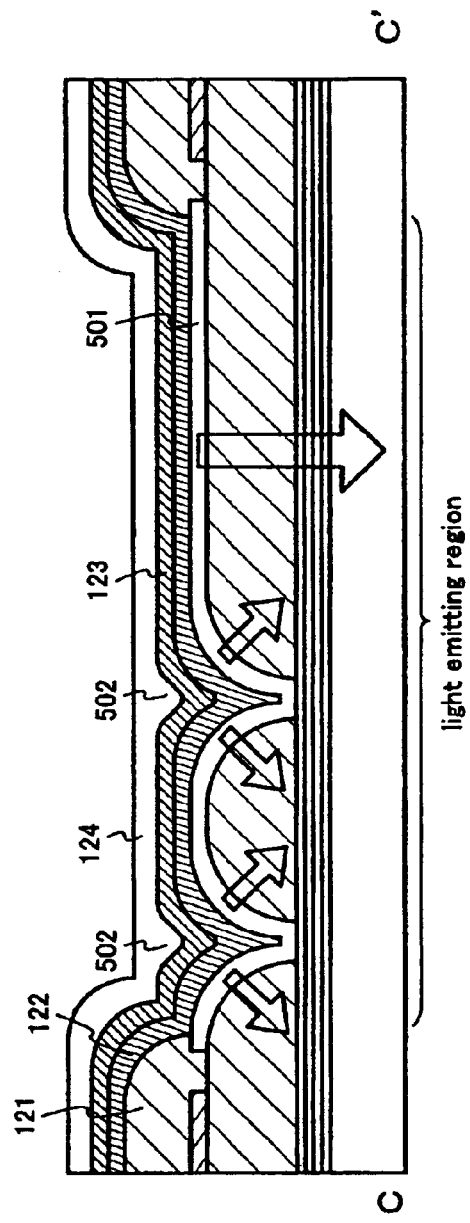

FIGS. 6A and 6B are drawings in correspondence with sectional views constituted by cutting a top view shown in FIG. 5A by lines B–B' and C–C'. Further, since a drawing in correspondence with a sectional view constituted by cutting FIG. 5A by a line A–A' is the same as FIG. 3A and therefore, an explanation thereof will be omitted here. As shown by FIGS. 6A and 6B, a curved face is formed at a surface of the pixel electrode 501 by the opening portion 502, as a result, light (particularly, propagated light) emitted from the light emitting layer 122 is emitted to the lower side at the curved face portion of the pixel electrode 501 and promotion of the efficiency of taking out light to outside is achieved.

As described above, by embodying the invention by the constitution shown in the embodiment, a surface of the pixel electrode 501 can be constituted by the curved face at the light emitting region at inside of the pixel and an effect of collecting propagated light can be provided. In this way, there can be provided the light emitting display device capable of promoting the efficiency of taking out the generated light to outside without particularly increasing the number of process, achieving bright image display by low power consumption and achieving bright image display without deteriorating reliability.

[Embodiment 3]

According to the embodiment, an explanation will be given of an example in which a shape of an opening portion provided at the light emitting region is different from that of Embodiment 1. An explanation will be given in reference to FIGS. 7A and 7B and FIGS. 8A and 8B, notations are provided only for constitutions different from those of Embodiment 1 and notations the same as those of Embodiment 1 are used for other portions.

Figure 7B:
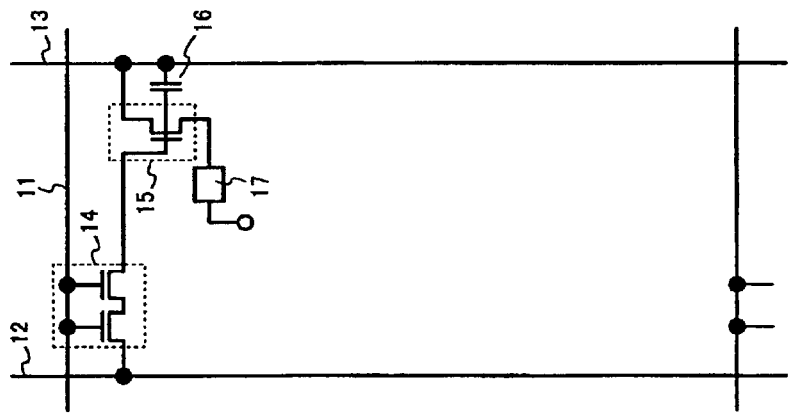
FIGS. 7A and 7B are a top view of a pixel and a circuit diagram of a light emitting device.
Figure 7A:
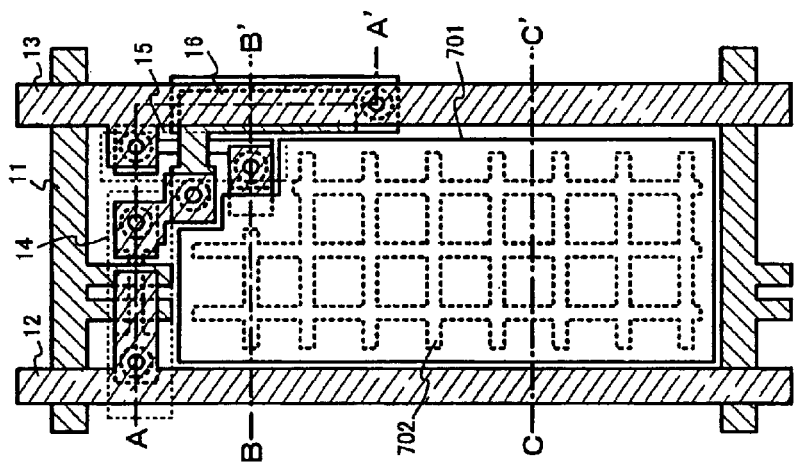

In FIG. 7A, constitutions different from those of Embodiment 1 are a pixel electrode 701 and an opening portion 702. The opening portion 702 is an example of constituting a shape of the opening portion by a lattice shape and providing a plurality of lattices to arrange regularly in a light emitting region. Further, it is not necessarily needed that the plurality of lattices are arranged regularly but a size of an individual lattice may be irregular.

FIGS. 8A and 8B are drawings in correspondence with sectional views constituted by cutting a top view shown in FIG. 7A by lines B–B' and C–C'. Further, a drawing correspondent to a sectional view constituted by cutting the top view by a line A–A' is the same as FIG. 3A and therefore, an explanation thereof will be omitted here. As shown by FIGS. 8A and 8B, a curved face is formed at a surface of the pixel electrode 701 by the opening portion 702, as a result, light (particularly, propagated light) emitted from the light emitting layer 122 is emitted to the lower side by the curved face portion of the pixel electrode 701 and promotion of the efficiency of taking out light to outside is achieved.

As described above, by embodying the invention by the constitution shown in the embodiment, the surface of the pixel electrode 701 can be constituted by the curved face at the light emitting region in the pixel and an effect of collecting the propagated light can be provided. In this way, there can be provided the light emitting display device capable of promoting the efficiently of taking out the generated light to outside without particularly increasing the number of process, achieving bright image display by low power consumption and achieving bright image display without deteriorating reliability.

[Embodiment 4]

According to the embodiment, an explanation will be given of an example of covering the surface of the flattening film 112 (also including the side surface of the opening portion 19) by an inorganic insulating film in Embodiment 1. An explanation will be given in reference to FIGS. 9A, 9B and 9C, notations are provided only for constitutions different from those of Embodiment 1 and notations used in Embodiment 1 are used for other portions pertinently as necessary.

Figures 9A, 9B, 9C:
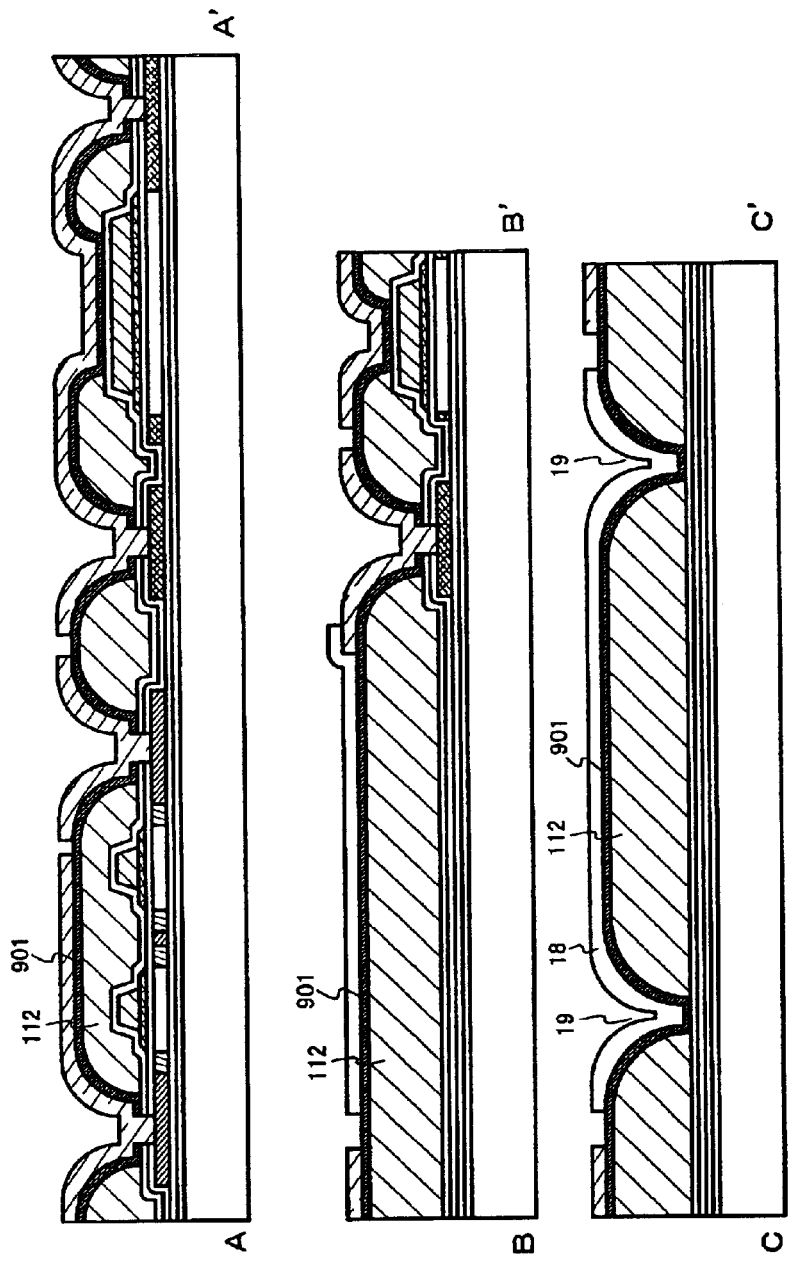
FIGS. 9A to 9C are sectional views of a pixel of a light emitting device.

FIGS. 9A through 9C are drawings respectively in correspondence with FIGS. 3A through 3C. In FIG. 9A, the surface of the flattening film 112 is covered by a barrier film 901. The barrier film 901 is provided after forming the opening portion 19 and therefore, formed to cover the side surface of the opening portion 19. Further, at a portion in contact with a transistor, in forming the first contact portion, the barrier film 901 is also etched to perforate. At this occasion, as shown by FIG. 9C, it is not particularly necessary to etch the barrier film 901 at a bottom face of the opening portion 19.

The constitution of the embodiment is effective in using an insulating film formed by a method of coating a solution (so-to-speak spin coating method) particularly as the flattening film 112. The constitution is effective when a resin film of, s representatively, a polyimide film, an acrylic resin film or the like is used as the flattening film and an effect thereof is restraining degassing from the flattening film 112.

In a related art, in the case of the insulating film formed by the spin coating method, although a solvent dissolved with a material for forming a film is coated by the spin coating method and the material is sintered to form a thin film. Although extra solvent is volatized in sintering, there is a case in which such a solvent remains in the film or moisture is adsorbed after forming the film. Therefore, after finishing the device, degassing is caused from inside of the film by heating to deteriorate an organic compound constituting the light emitting layer.

However, according to the constitution of the embodiment, degassing from the flattening film 112 can be restrained by the barrier film 901 and therefore, a degassed component dose not reach the light emitting layer provided over the flattening film 112 and a highly reliable display device which is not deteriorated can be provided even after finishing the light emitting display device. Further, it is also effective to prevent the degassed component from diffusing to the side of the transistor by providing the same barrier film blow the flattening film 112.

As the barrier film 901, a thin film having a blocking effect against oxygen and moisture can be used and a silicon nitride film, a silicon nitroxide film, an aluminum oxide film, an aluminum nitroxide film or a diamond-like carbon film can be used therefor. Further, in forming the barrier film 901, it is preferable to form the film by using a sputtering method in order to minimize degassing from being brought about from the flattening film 112.

By embodying the invention by the constitution shown in the embodiment, reliability of the light emitting display device can particularly be promoted. Naturally, the embodiment can be embodied by combining with any constitution of Embodiments 1 through 3.

[Embodiment 5]

Figure 10A:
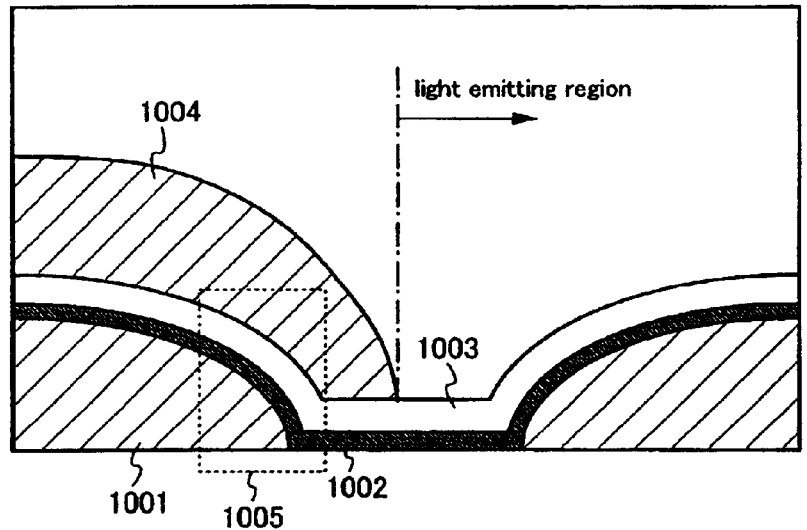
FIGS. 10A and 10B are sectional views of a portion of a pixel of a light emitting device.

According to the embodiment, an explanation will be given of a position of forming an insulating film (correspondent to the insulating film 121 in Embodiment 1) for partitioning the light emitting region in reference to FIGS. 10A and 10B. In FIG. 10A, numeral 1001 designates a flattening film and FIG. 10A is a sectional view precisely cutting an opening portion. Numeral 1002 designates a silicon nitride film functioning as a barrier film, numeral 1003 designates a pixel electrode and numeral 1004 designates an insulating film for partitioning the light emitting region.

In the case of FIG. 10A, an end portion of the insulating film 1004 is patterned to be contained in the opening portion. When such a constitution is constructed, luminescence is not caused in a region 1005 surrounded by a dotted line in the drawing and therefore, light advancing to an outer side of the light emitting region can be reduced. Although the light advancing to the outer side of the light emitting region contributes to an increase in the brightness, the light also dims a contour of a pixel and therefore, it is preferable to construct the constitution as shown by FIG. 10A in the case of achieving highly fine image quality.

Figure 10B:
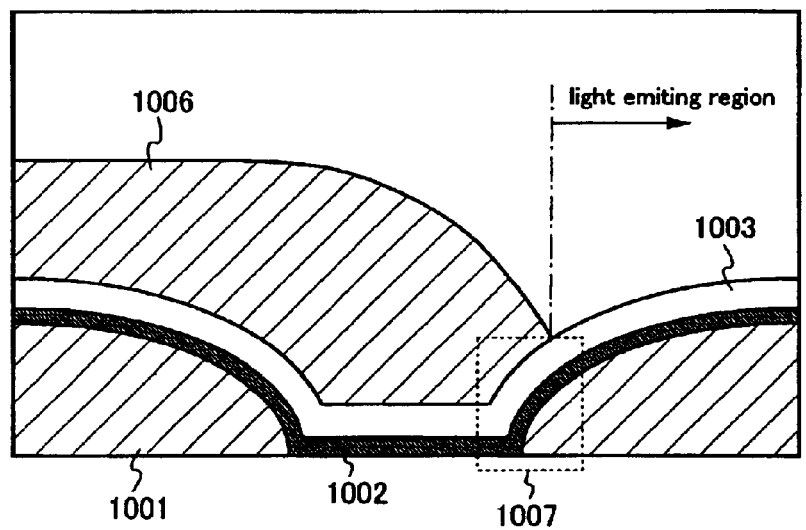

Further, in the case of FIG. 10B, an insulating film 1006 is provided to conceal a bottom face of an opening portion and only a portion of a side surface is exposed. When such a constitution is constructed, luminescence is not caused in a region 1007 surrounded by a dotted line in the drawing. This is because when the light emitting layer does not excellently rides over an end portion of the flattening film 1001 (a portion of thickening a film thickness) there is a concern of making a deterioration progress from the portion and therefore, the region is constructed by a constitution which is not used as a light emitting region. Actually, when the radius of curvature of the side surface of the opening portion provided at the flattening film 1001 is large, a problem is not particularly posed, however, when the radius of curvature is small, such a constitution is effective as a constitution of promoting reliability. Naturally, also light progressing to the outer side of the light emitting region can also be restrained similar to FIG. 10A and therefore, an advantage of achieving highly fine image quality is also provided.

As described above, by embodying the invention by the constitution shown in the embodiment, promotion of the image quality of the light emitting display device can be achieved and also reliability can be promoted. Naturally, the embodiment can be embodied also by combining with any constitution of Embodiments 1 through 4.

[Embodiment 6]

Structures of the thin film transistors described in Embodiments 1 though 5 are top gate type (more specifically, planer structure), respectively. However, the present invention is not limited to thereof, and a bottom gate structure (more specifically, inversed stagger structure) can be applied to thin film transistors in each embodiment. Further, the present invention is not necessarily limited to a thin film transistor, and may be applied to a transistor having a MOS structure that is formed by using a silicon well.

[Embodiment 7]

In this embodiment, a structure of the entire light emitting display device that can apply the present invention will be described with reference to FIGS. 11A and 11C. FIG. 11A is a top view of a light emitting display device produced by sealing an element substrate in which thin film transistors are formed with a sealing material. FIG. 11B is a cross sectional view along a line B–B' in FIG. 11A. FIG. 11C is a cross sectional view along a line A–A' in FIG. 11A.

A pixel portion (display portion) 22, a data line driver circuit 23, gate line driver circuits 24a and 24b, and a protective circuit 25, which are provided so as to surround the pixel portion 22, are located on a substrate 21, and a seal material 26 is provided to surround them. The structure of the pixel portion 22 preferably refers to Embodiments 1 to 4 and its description. As the seal material 26, a glass material, a metallic material (typically, a stainless material), a ceramic material, or a plastic material (including a plastic film) can be used. As shown in Embodiments 1 to 4, it can be also sealed with only an insulating film. In addition, it is necessary to use a translucent material according to a radiation direction of light from a light emitting element.

The seal material 26 may be provided to partially overlap with the data line driver circuit 23, the gate line driver circuits 24a and 24b, and the protective circuit 25. A cover material 27 is provided using the seal material 26, so that an airtight space 28 is produced by the substrate 21, the seal material 26, and the cover material 27. A hygroscopic agent (barium oxide, calcium oxide, or the like) 29 is provided in advance in a concave portion of the cover material 27, so that it has a function of absorbing moisture, oxygen, and the like to keep an atmosphere clean in a portion of the above airtight space 28, thereby suppressing the deterioration of a light emitting layer. The concave portion is covered with a cover material 30 with a fine mesh shape. The cover material 30 allows air and moisture to pass therethrough but not the hygroscopic agent 29. Note that the airtight space 28 is preferably filled with a noble gas such as nitrogen or argon, and can be also filled with a resin or a liquid if it is inert.

Also, an input terminal portion 31 for transmitting signals to the data line driver circuit 23 and the gate line driver circuits 24a and 24b is provided on the substrate 21. Data signals such as video signals are transferred to the input terminal portion 31 through a FPC (flexible printed circuit) 32. With respect to a cross section of the input terminal portion 31, as shown in FIG. 11B, an input wiring having a structure in which an oxide conductive film 34 is laminated on a wiring 33 formed together with a gate wiring or a data wiring is electrically connected with a wiring 35 provided in the FPC 32 side through a resin 37 to which conductors 36 are dispersed. Note that a spherical polymer compound for which plating processing using gold or silver is conducted is preferably used for the conductors 36.

Also, an enlarged view of a region 38 surrounded by a dotted line in FIG. 11C is shown in FIG. 11D. The protective circuit 25 is preferably composed by combining a thin film transistor 39 and a capacitor 40, and any known structure may be used therefor. The present invention has such a feature that the formation of the capacitor is possible without increasing the number of photolithography steps together with the improvement of contact holes. In this embodiment, the capacitor 40 is formed utilizing the feature. Note that the structure of the thin film transistor 39 and that of the capacitor 40 can be understood if Embodiment 1 and description thereof are referred to, and therefore the description is omitted here.

In this embodiment, the protective circuit 25 is provided between the input terminal portion 31 and the data line driver circuit 23. When an electrostatic signal such as an unexpected pulse signal is inputted therebetween, the protective circuit releases the pulse signal to the outside. At this time, first, a high voltage signal which is instantaneously inputted can be dulled by the capacitor 40, and other high voltages can be released to the outside through a circuit composed of a thin film transistor and a thin film diode. Of course, the protective circuit may be provided in other location, for example, a location between the pixel portion 22 and the data line driver circuit 23 or locations between the pixel portion 22 and the gate line driver circuits 24a and 24b.

As described above, according to this embodiment, when the present invention is carried out, an example in which the capacitor used for the protective circuit for electrostatic countermeasures and the like which is provided in the input terminal portion is simultaneously formed is indicated. This embodiment can be carried out by being combined with any structure of Embodiments 1 to 6.

[Embodiment 8]

Examples of electronics employing a light emitting display device of the present invention to a display portion are: a video camera; a digital camera; a goggle type display (head mounted display); a navigation system; an audio reproducing apparatus (car audio, an audio component, and the like); a laptop computer; a game machine; a portable information terminal (a mobile computer, a cellular phone, a portable game machine, an electronic book, etc.); and an image reproducing apparatus including a recording medium (specifically, an appliance capable of processing data in a recording medium such as a Digital Versatile Disk (DVD) and having a display apparatus that can display the image of the data). Specific examples of the electronics are shown in FIGS. 12A to 12H.

Figure 12A:
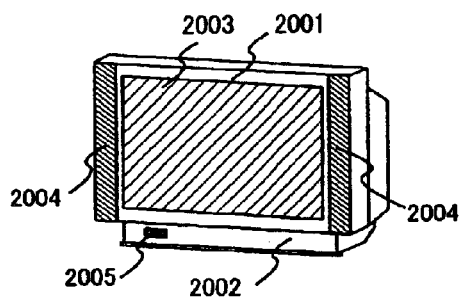
FIGS. 12A to 12H are views showing specific examples of electric apparatus.

FIG. 12A shows a television, which comprises a casing 2001, a supporting base 2002, a display portion 2003, speaker portions 2004, a video input terminal 2005, etc. The present invention is applied to the display portion 2003. The term television includes every television for displaying information such as one for a personal computer, one for receiving TV broadcasting, and one for advertisement.

Figure 12B:
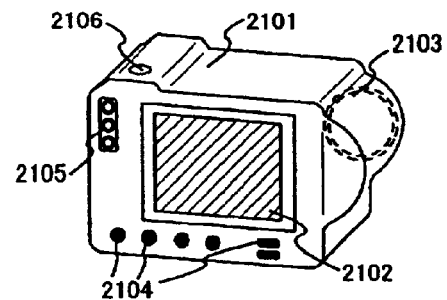

FIG. 12B shows a digital camera, which comprises a main body 2101, a display portion 2102, an image receiving portion 2103, operation keys 2104, an external connection port 2105, a shutter 2106, etc. The present invention is applied to the display portion 2102.

Figure 12C:
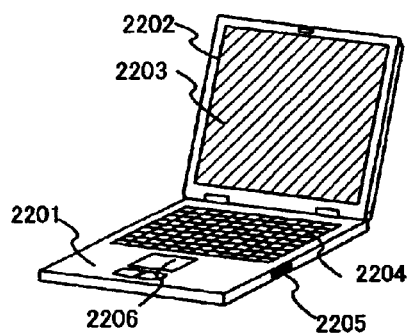

FIG. 12C shows a laptop computer, which comprises a main body 2201, a casing 2202, a display portion 2203, a keyboard 2204, an external connection port 2205, a pointing mouse 2206, etc. The present invention is applied to the display portion 2203.

Figure 12D:
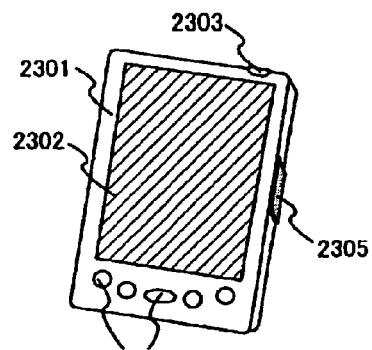

FIG. 12D shows a mobile computer, which comprises a main body 2301, a display portion 2302, a switch 2303, operation keys 2304, an infrared ray port 2305, etc. The present invention is applied to the display portion 2302.

Figure 12E:
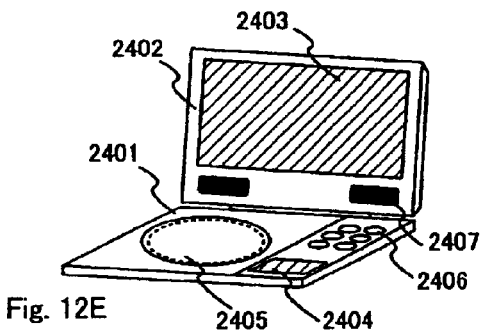

FIG. 12E shows a portable image reproducing apparatus equipped with a recording medium (a DVD player, to be specific). The apparatus comprises a main body 2401, a casing 2402, a display portion A 2403, a display portion B 2404, a recording medium (such as DVD) reading portion 2405, operation keys 2406, speaker portions 2407, etc. The display portion A 2403 mainly displays image information whereas the display portion B 2404 mainly displays text information. The present invention is applied to the display portions A 2403 and B 2404. The term image reproducing apparatus equipped with a recording medium includes domestic game machines.

Figure 12F:
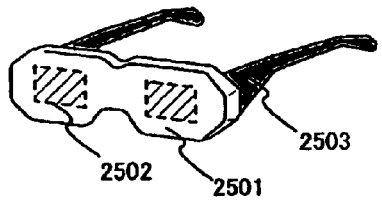

FIG. 12F shows a goggle type display (head mounted display), which comprises a main body 2501, display portions 2502, and arm portions 2503. The present invention is applied to the display portion 2502.

Figure 12G:
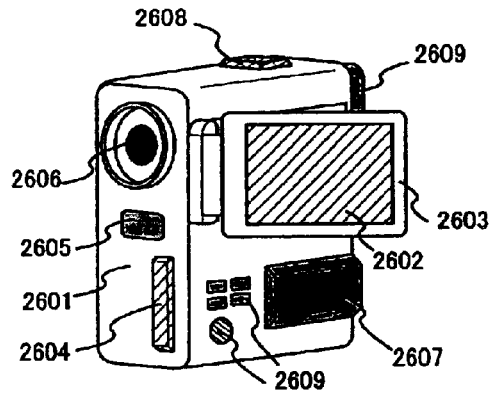

FIG. 12G shows a video camera, which comprises a main body 2601, a display portion 2602, a casing 2603, an external connection port 2604, a remote control receiving portion 2605, an image receiving portion 2606, a battery 2607, an audio input portion 2608, operation keys 2609, etc. The present invention is applied to the display portion 2602.

Figure 12H:
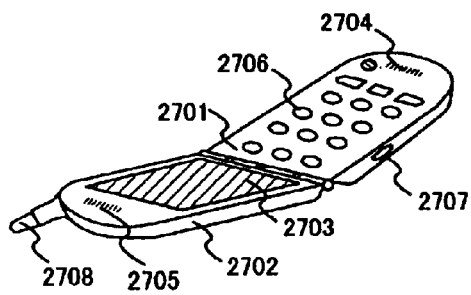

FIG. 12H shows a cellular phone, which comprises a main body 2701, a casing 2702, a display portion 2703, an audio input portion 2704, an audio output portion 2705, operation keys 2706, an external connection port 2707, an antenna 2708, etc. The present invention is applied to the display portion 2703. If the display portion 2703 displays white characters on a black background, power consumption of the cellular phone can be reduced.

As described above, the display apparatus obtained by applying the present invention may be used as the display portions of every electronics. Also, the electronics of the present Embodiment may use any constitutions of the light emitting display device shown in Embodiments 1 to 7.

According to the invention, a direction of advancing propagated light propagated at inside of a light emitting layer can be corrected to a lower direction by providing a curved face at a surface of a pixel electrode in a light emitting region to thereby promote an efficiency of taking out light to outside. Further, the surface of the pixel electrode can be constituted by the curved face by only providing an opening at an insulating film therebelow and an increase in the number of processes is not particularly brought about. As a result, there can be provided a light emitting device capable of achieving bright image display by low power consumption by promoting the efficiency of taking out light to outside and achieving light image display without deteriorating reliability.

What is claimed is:

1. A light emitting device comprising:
   a plurality of pixels provided with light emitting elements; and
   a thin film transistor and a pixel electrode electrically connected to the thin film transistor provided at each of the plurality of pixels,
   wherein an insulating film is provided over the thin film transistor and the pixel electrode is provided over the insulating film,
   wherein the insulating film includes an opening portion, a side surface of which is curved at a light emitting region, and
   wherein each of the light emitting elements comprises the pixel electrode, a light emitting layer, and an opposed electrode.

2. The light emitting device according to claim 1, wherein the pixel electrode comprises an oxide conductive film.

3. The light emitting device according to claim 1, wherein the insulating film is a photosensitive resin film.

4. The light emitting device according to claim 1, wherein the opening portion has a shape of a groove.

5. The light emitting device according to claim 1, wherein the opening portion has a circular shape.

6. The light emitting device according to claim 1, wherein the opening portion has a shape of a lattice.

7. A light emitting device according to claim 1, wherein the light emitting layer comprises an organic compound.

8. A light emitting device comprising:
   a plurality of pixels provided with light emitting elements; and
   a thin film transistor and a pixel electrode electrically connected to the thin film transistor provided at each of the plurality of pixels,
   wherein an insulating film is provided over the thin film transistor and the pixel electrode is provided over the insulating film,
   wherein the insulating film includes an opening portion a side surface of which is curved at a light emitting region and the pixel electrode covers, a side surface of the opening portion, and
   wherein each of the light emitting elements comprises the pixel electrode, a light emitting layer, and an opposed electrode.

9. The light emitting device according to claim 8, wherein the pixel electrode comprises an oxide conductive film.

10. The light emitting device according to claim 8, wherein the insulating film is a photosensitive resin film.

11. The light emitting device according to claim 8, wherein the opening portion has a shape of a groove.

12. The light emitting device according to claim 8, wherein the opening portion has a circular shape.

13. The light emitting device according to claim 8, wherein the opening portion has a shape of a lattice.

14. A light emitting device according to claim 8, wherein the light emitting layer comprises an organic compound.

15. A light emitting device comprising:
    a plurality of pixels provided with light emitting elements; and
    a thin film transistor and a pixel electrode electrically connected to the thin film transistor provided at each of the plurality of pixels;
    wherein an insulating film is provided over the thin film transistor and the pixel electrode is provided over the insulating film,
    wherein the insulating film includes an opening portion, a side surface of which is curved at a light emitting region and a surface of the pixel electrode includes a curved face along a shape of the opening portion, and
    wherein each of the light emitting elements comprises the pixel electrode, a light emitting layer, and an opposed electrode.

16. The light emitting device according to claim 15, wherein the pixel electrode comprises an oxide conductive film.

17. The light emitting device according to claim 15, wherein the insulating film is a photosensitive resin film.

18. The light emitting device according to claim 15, wherein the opening portion has a shape of a groove.

19. The light emitting device according to claim 15, wherein the opening portion has a circular shape.

20. The light emitting device according to claim 15, wherein the opening portion has a shape of a lattice.

21. A light emitting device according to claim 15, wherein the light emitting layer comprises an organic compound.

22. A light emitting device comprising:
    a plurality of pixels comprising a plurality of thin film transistors, a plurality of pixel electrodes, and a plurality of light emitting elements; and
    a insulating film formed over the plurality of thin film transistors, wherein the plurality of pixel electrodes are formed over the insulating film,
    wherein the insulating film has at least one opening portion in each of the plurality of the pixels,
    wherein the opening portion has a curved side surface at a light emitting region, and
    wherein each of the light emitting elements comprises the pixel electrode, a light emitting layer, and an opposed electrode.

23. A light emitting device according to claim 22, wherein the pixel electrode covers a surface of the opening portion and the insulating film.

24. A light emitting device according to claim 22, wherein the light emitting layer comprises an organic compound.

25. A light emitting device comprising:
    a plurality of pixels, each of which comprises a thin film transistor, a pixel electrode electrically connected to the thin film transistor, and a light emitting element having the pixel electrode, a light emitting layer, and an opposed electrode over the thin film transistor,
    wherein at least one island shaped insulating layer is formed in each of the plurality of pixels,
    wherein the pixel electrode is formed over the island shaped insulating layer,
    wherein the island shaped insulating layer has at least one opening portion and the opening portion has a curved side surface.

26. A light emitting device according to claim 25, wherein the device further comprises a data wiring, and the opening portion is formed along with the data wiring.

27. A light emitting device according to claim 25, wherein the pixel electrode covers a surface of the island shaped insulating layer and the opening portion.

28. A light emitting device according to claim 25, wherein the light emitting layer comprises an organic compound.

* * * * *